(12) United States Patent
Pu et al.

(10) Patent No.: US 11,923,489 B1
(45) Date of Patent: Mar. 5, 2024

(54) GROWTH SUBSTRATE, DISPLAY PANEL, AND MANUFACTURING METHOD OF DISPLAY PANEL

(71) Applicant: HKC CORPORATION LIMITED, Shenzhen (CN)

(72) Inventors: Yang Pu, Shenzhen (CN); Baohong Kang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/331,279

(22) Filed: Jun. 8, 2023

(30) Foreign Application Priority Data

Sep. 29, 2022 (CN) .......................... 202211197854.4

(51) Int. Cl.
*H01L 33/58* (2010.01)
*H01L 25/075* (2006.01)

(52) U.S. Cl.
CPC .......... *H01L 33/58* (2013.01); *H01L 25/0753* (2013.01); *H01L 2933/0058* (2013.01)

(58) Field of Classification Search
CPC ...................................................... H01L 33/58
USPC ........................................................... 257/79
See application file for complete search history.

(56) References Cited

U.S. PATENT DOCUMENTS

| | | | |
|---|---|---|---|
| 2015/0111329 A1 | 4/2015 | Wu et al. | |
| 2018/0114878 A1 | 4/2018 | Danesh et al. | |
| 2018/0114886 A1 | 4/2018 | Liu et al. | |
| 2020/0357779 A1 | 11/2020 | Kwag et al. | |
| 2021/0135044 A1 | 5/2021 | Zou et al. | |
| 2023/0065563 A1* | 3/2023 | Hsiao | ................... H01L 33/486 |

FOREIGN PATENT DOCUMENTS

| | | |
|---|---|---|
| CN | 102176486 | 9/2011 |
| CN | 105870265 | 8/2016 |
| CN | 109326685 | 2/2019 |
| CN | 109417065 | 3/2019 |
| CN | 112382643 | 2/2021 |

OTHER PUBLICATIONS

CNIPA, Notification to Grant Patent Right for Invention for CN Application No. 202211197854.4, dated Nov. 25, 2022.
CNIPA, First Office Action for CN Application No. 202211197854.4, dated Nov. 11, 2022.

* cited by examiner

*Primary Examiner* — Hsin Yi Hsieh
(74) *Attorney, Agent, or Firm* — Hodgson Russ LLP (57) ABSTRACT

A growth substrate and the display panel include a substrate, including chip growth regions arranged at intervals and in an array and a non-growth region located among chip growth regions. The growth substrate includes a refraction structure disposed on the substrate. An orthographic projection of the refraction structure on the substrate covers the non-growth region without overlapping with at least parts of the chip growth regions. The refraction structure is configured to refract light corresponding to the non-growth region to positions corresponding to the chip growth regions. The substrate has a first surface and a second surface and light emitting chips are grown in the chip growth regions of the first surface. The refraction structure is disposed on the second surface, an orthographic projection on the substrate covers the non-growth region, and one side, away from the substrate, of the refraction structure is a light incident side.

14 Claims, 6 Drawing Sheets

GROWTH SUBSTRATE, DISPLAY PANEL, AND MANUFACTURING METHOD OF DISPLAY PANEL

CROSS-REFERENCE TO RELATED APPLICATIONS

This application claims priority to Chinese Patent Application No. 202211197854.4, filed Sep. 29, 2022, the entire contents of which are incorporated herein by reference.

TECHNICAL FIELD

The present disclosure relates to the technical field of display lighting equipment, and more particularly, to a growth substrate, a display panel, and a manufacturing method of the display panel.

BACKGROUND

At this stage, there is a transfer method with a relatively simple transfer process, which is to directly bond a wafer (growth substrate) of a grown and prepared LED (light emitting diode) to a driving backplane (called direct bonding).

Specifically, an LED electrode is fixed by melting and then cooling an indium or stannum (In/Sn) spot on the driving backplane so as to complete bonding, and then a sapphire substrate used for the growth of the LED is removed by virtue of LLO (laser lift-off), thus completing the transfer. This method does not require additional intermediate steps of transfer, transient substrates, etc. The method is simple and low in cost.

However, the LLO is performed after the LED is bonded to the driving backplane. Therefore, if RGB three-color products need to be prepared, the LEDs (light emitting diode) of one color (such as R LEDs) need to be transferred first, and then G/B LEDs are transferred. That is, when the R LEDs are transferred, the G\B positions on the driving backplane need to be vacant. At this time, LLO laser will directly irradiate the In/Sn spot and a circuit on the backplane through a region between the two R LEDs, which will cause damage to a bonding point and the driving backplane, resulting in making it impossible to perform the subsequent bonding of G\B LEDs. Therefore, at present, this method can only carry out one LLO, that is, the transfer of LEDs of one color, such as the preparation of RRR products (the region, originally used to bond the GB LED positions, on the driving backplane is bonded to the R LEDs at one time).

SUMMARY

There are provided a growth substrate, a display panel, and a manufacturing method of the display panel according to embodiments of this disclosure. The technical solution of this disclosure is as below:

According to a first aspect of the present disclosure, there is provided a growth substrate, including: a substrate. The substrate includes a plurality of chip growth regions arranged at intervals and in an array and a non-growth region located among the plurality of chip growth regions. The growth substrate further includes a refraction structure disposed on the substrate. The orthographic projection of the refraction structure on the substrate covers the non-growth region without overlapping with at least parts of the chip growth regions. The refraction structure is configured to refract light corresponding to the non-growth region to positions corresponding to the chip growth regions. The substrate has a first surface and a second surface that are opposite to each other in a thickness direction of the substrate, and light emitting chips are grown in the chip growth regions of the first surface. The refraction structure is disposed on the second surface, an orthographic projection on the substrate covers the non-growth region, and one side, away from the substrate, of the refraction structure is a light incident side.

According to a second aspect of the present disclosure, there is provided a manufacturing of a display panel, including: providing a driving backplane, where the driving backplane has a plurality of bonding regions arranged in an array; providing a growth substrate, where the growth substrate includes a substrate, light emitting chips, and a refraction structure, where the substrate includes a plurality of chip growth regions arranged at intervals and in an array and a non-growth region located among the plurality of chip growth regions, the light emitting chips are correspondingly formed in the chip growth regions, and the orthographic projection of the refraction structure on the substrate covers the non-growth regions; wherein the substrate has a first surface and a second surface that are opposite to each other in a thickness direction of the substrate, and light emitting chips are disposed on the first surface, wherein the refraction structure is disposed on the second surface, and one side, away from the substrate, of the refraction structure is a light incident side; connecting the growth substrate to the driving backplane in an alignment manner to bond the light emitting chips on the substrate to the bonding regions aligned with the light emitting chips; providing a light source on one side, away from the driving backplane, of the growth substrate; and performing a lift-off process on the light emitting chips and the substrate by virtue of light emitted by the light source after the light emitting chips are bonded to the bonding regions aligned with the light emitting chips.

According to a third aspect of the present disclosure, there is provided a display panel, which is manufactured according to the above manufacturing method.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the present disclosure and together with the description serve to explain the principles of the present disclosure. Apparently, the accompanying drawings in the following description are only some embodiments of the present disclosure, and those skilled in the art can obtain other accompanying drawings according to these accompanying drawings without creative efforts.

DESCRIPTION OF THE EMBODIMENTS

Example embodiments will now be described more fully with reference to the accompanying drawings. Example embodiments may, however, be embodied in many forms and should not be construed as limited to the examples set forth herein; rather, these embodiments are provided so that the present disclosure will be thorough and complete and fully convey the concept of example embodiments to those skilled in the art.

Furthermore, the described features, structures, or characteristics may be combined in any suitable manner in one or more embodiments. In the following description, numerous specific details are provided in order to give a thorough understanding of the embodiments of the present disclosure. However, those skilled in the art will appreciate that the technical solutions of the present disclosure may be practiced without one or more of the specific details, or other methods, components, devices, steps, etc. may be employed. In other instances, well-known methods, devices, implementations, or operations have not been shown or described in detail to avoid obscuring aspects of the present disclosure.

The present disclosure will be described in further detail below in conjunction with the accompanying drawings and specific embodiments. It should be noted here that the technical features involved in the various embodiments of the present disclosure described below may be combined as long as they do not constitute conflicts with each other. The embodiments described below by referring to the accompanying drawings are exemplary, and are intended to explain the present disclosure, and should not be construed as limiting the present disclosure.

Embodiment 1

Referring to FIG. 1 to FIG. 6, an embodiment of the present disclosure provides a growth substrate for directly bonding a grown and prepared light emitting chip 12 to a driving backplane (called direct bonding).

Figure 1:
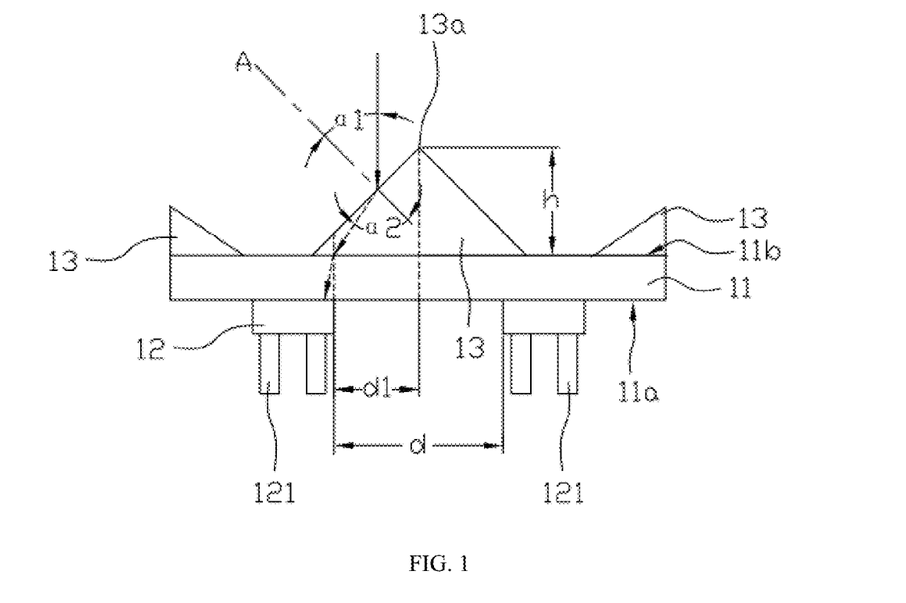
FIG. 1 shows a schematic diagram of a partial cross-sectional structure of a growth substrate according to Embodiment 1 of the present disclosure.

As an example, a light emitting chip 12 is, for example, an LED (light emitting diode). An electrode part 121 of the LED is fixed by melting and cooling an indium or stannum (In/Sn) spot on the driving backplane to complete the bonding of the LED on the driving backplane, and then the LED and the growth substrate are lifted off each other through laser (LLO), thus completing the transfer.

It should be understood that the growth substrate is used to directly bond the grown and prepared LED (light emitting diode) to the driving backplane (called direct bonding). This method does not require additional intermediate steps of transfer, transient substrates, etc. The method is simple and low in cost.

In some embodiments, when the growth substrate is prepared to transfer RGB three-color products (LEDs of red, green, and blue colors), LEDs of one color may be transferred first (such as R LED), and then LEDs of the other two colors are transferred. That is, when the R LEDs are transferred, the positions of LEDs of the other two colors on the driving backplane need to be vacant.

As an example, the pitch between every two LEDs (the distance between two LEDs) is equal to 3 times the pixel pitch (3 times the pixel pitch of a display).

In this embodiment, the growth substrate includes a substrate 11 for the growth of the light emitting chips 12. The substrate 11 is made of a sapphire material.

As an example, the light emitting chip 12 is a Mini LED (submillimeter light emitting diode), that is, an LED (light emitting diode) device in which the sizes of the light emitting chips 12 are between 50 and 200 μm. The light emitting chip 12 refers to a unit consisting of a Mini LED pixel array and a driving circuit, with a pixel center spacing of 0.3-1.5 mm.

As an example, the light emitting chip 12 is a Micro LED (micron light emitting diode). Micro LED display technology refers to a display technology that uses self-illuminating micron-scale LEDs (light emitting diodes) as light emitting pixel units and assembles them on the driving backplane to form a high-density LED array.

Figure 4:
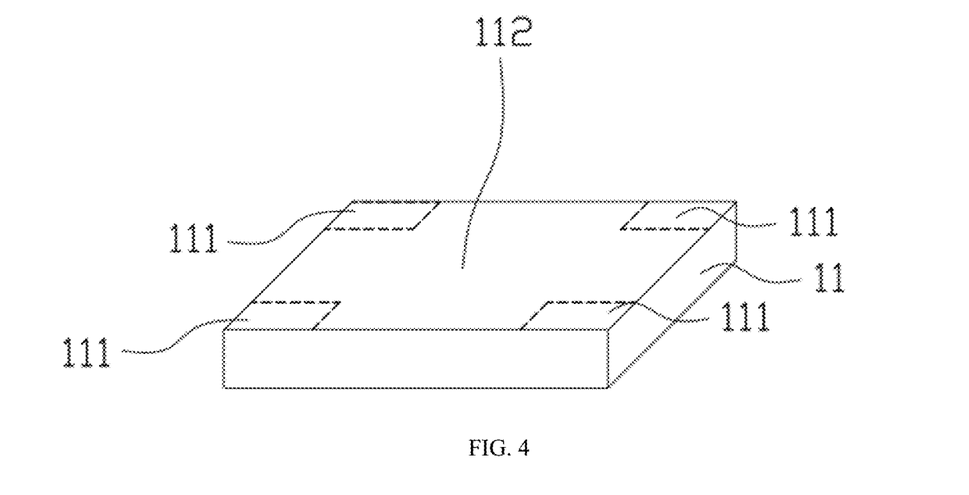
FIG. 4 shows a schematic diagram of a planar structure of a substrate according to Embodiment 1 of the present disclosure.

In this embodiment, as shown in FIG. 4, the substrate 11 includes a plurality of chip growth regions 111 arranged at intervals and in an array and a non-growth region 112 located among the plurality of chip growth regions 111.

Figure 5:
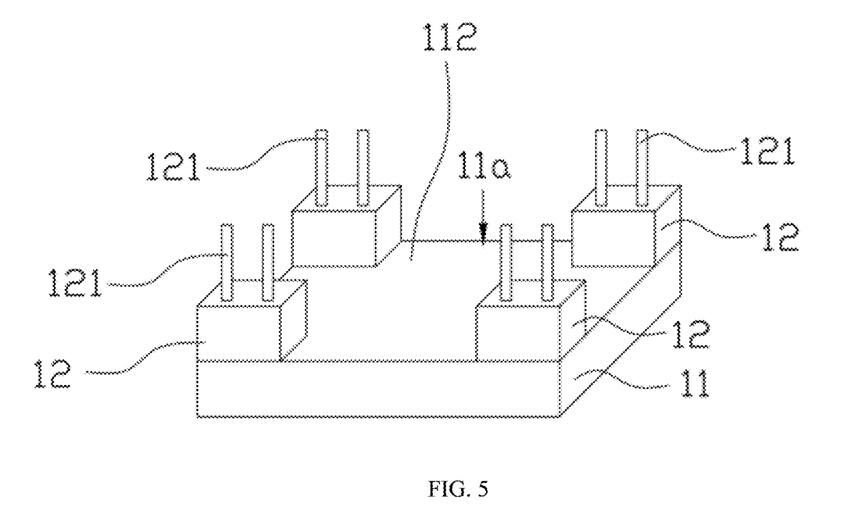
FIG. 5 shows a schematic diagram of a planar structure of a growth substrate according to Embodiment 1 of the present disclosure.
Figure 6:
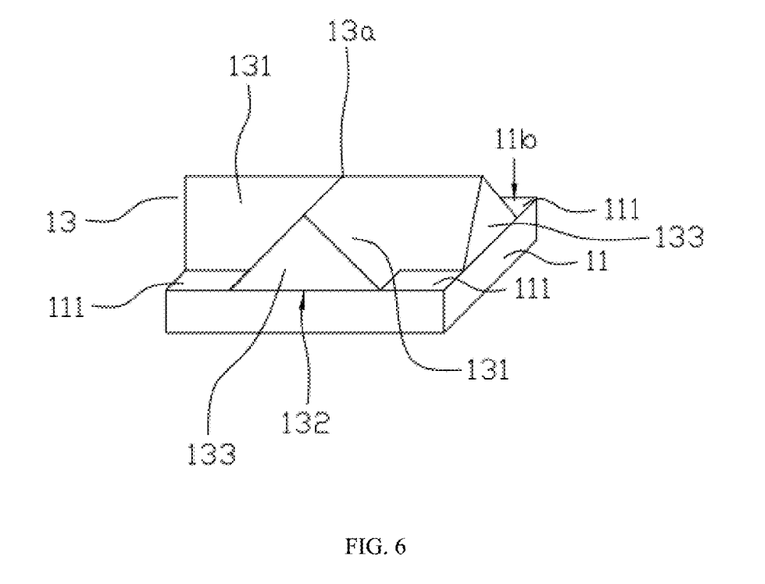
FIG. 6 shows a schematic diagram of a planar structure of a growth substrate from another viewing angle according to Embodiment 1 of the present disclosure.

It should be understood that as shown in FIGS. 4 to 6, the chip growth regions 111 and the non-growth region 112 together cover the entire surface of the substrate 11, and the chip growth regions 111 and the light emitting chips 12 are arranged in a one-to-one correspondence manner.

In this embodiment, as shown in FIG. 6, the growth substrate further includes a refraction structure 13 disposed on the substrate 11. The orthographic projection of the refraction structure 13 on the substrate 11 completely covers the non-growth region 112 without overlapping with at least parts of the chip growth regions 111. The refraction structure 13 is used to refract light corresponding to the non-growth region 112 to the positions corresponding to the chip growth regions 111.

It should be understood that the refraction structure 13 and the light emitting chips 12 together cover the entire surface of the substrate 11. The refraction structure 13 and the light emitting chips 12 may be located on the same side of the substrate 11, or may be located on two opposite sides of the substrate 11. However, it ensures that when passing through the substrate 11, light will irradiate one of the refraction structure 13 and the light emitting chips 12.

Figure 3:
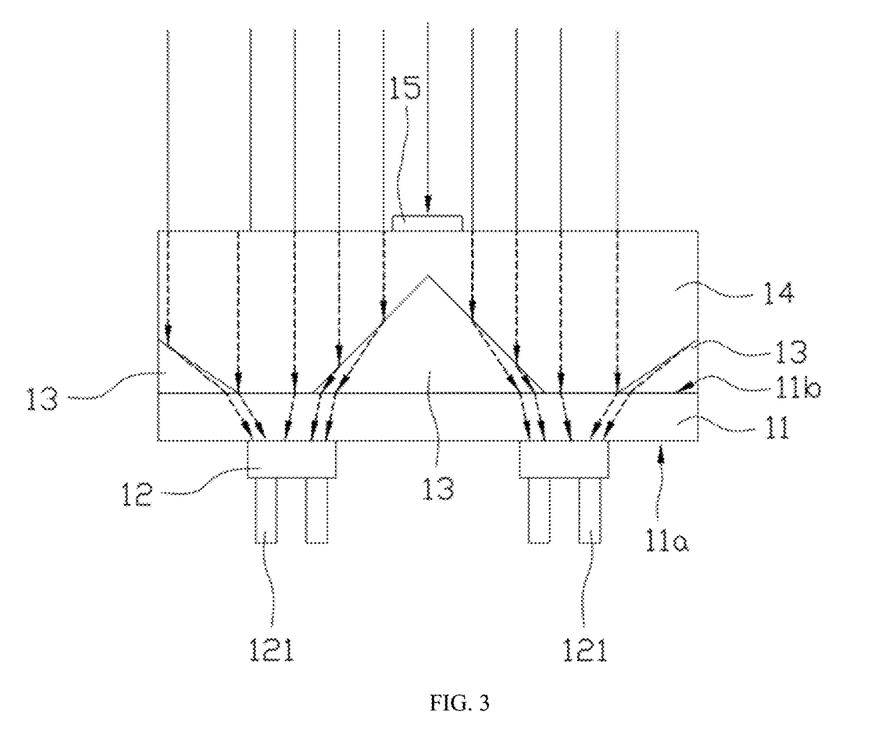
FIG. 3 shows a schematic diagram of a path of light passing through a growth substrate according to Embodiment 1 of the present disclosure.

In the present disclosure, as shown in FIG. 3, when the growth substrate transfers the chips to the driving backplane by LLO, light irradiating toward the non-growth region 112 of the substrate 11 passes through the refraction structure 13 to be refracted, so that the propagation path of the light is changed, and at least part of the light is refracted from the non-growth region 112 toward the chip growth regions 111. Therefore, the probability that light irradiates the bonding region, corresponding to the non-growth region 112, of the driving backplane may be reduced to ensure that the circuit in the bonding region is not damaged, so as to facilitate the subsequent secondary transfer; and light emitted by the laser can be gathered toward the chip growth regions 111, thereby reducing the laser energy and saving costs.

In this embodiment, as shown in FIG. 3, FIG. 4 and FIG. 5, the substrate 11 has a first surface 11a and a second surface 11b that are opposite to each other in a thickness direction of the substrate 11, and light emitting chips 12 are grown in the chip growth regions 111 of the first surface 11a. The light emitting chips 12 cover the entire chip growth regions 111.

In this embodiment, as shown in FIG. 6, the refraction structure 13 is disposed on the second surface 11b. The orthographic projection on the substrate 11 at least covers the entire non-growth region 112. One side, away from the substrate 11, of the refraction structure 13 is a light incident side.

Of course, in other embodiments, the refraction structure 13 may further be disposed on the first surface 11a, and is located between the plurality of chip growth regions 111. However, regardless of whether the refraction structure 13 is located on the first surface 11a or the second surface 11b, the orthographic projection of the refraction structure 13 at least covers the non-growth region 112.

It should be understood that when the refraction structure 13 is disposed on the second surface 11b and the orthographic projection on the substrate 11 covers the non-growth region 112, and when light emitted by the laser is emitted from the second surface 11b toward the first surface 11a, the light first passes through the refraction structure 13 to be refracted, then passes through the second surface 11b of the substrate 11, and propagates toward the positions of the chip growth regions 111 until the light is emitted from the positions directly opposite to the chip growth regions 111 of the first surface 11a and irradiates the light emitting chips 12. Therefore, not only is the probability that the light emitted by the laser directly irradiates the position of the non-growth region 112 directly opposite to the driving backplane reduced, but also the light emitted by the laser is gathered toward the chip growth regions 111, so as to facilitate the lift-off of the light emitting chips 12 and increase the utilization rate of the light.

When the refraction structure 13 is disposed on the first surface 11a, the probability that the light emitted by the laser directly irradiates the position of the non-growth region 112 directly opposite to the driving backplane can be reduced.

Figure 2:
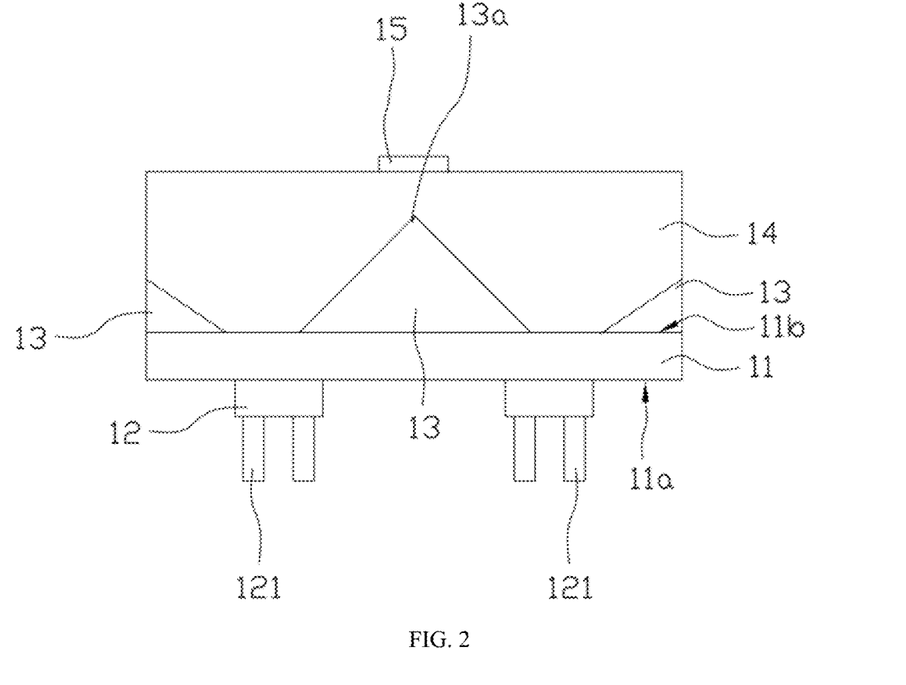
FIG. 2 shows a schematic diagram of a cross-sectional structure of a growth substrate provided with an adjustment layer according to Embodiment 1 of the present disclosure.

In this embodiment, as shown in FIGS. 1 to 3, the orthographic projection of the refraction structure 13 on the substrate 11 further covers the edges of the chip growth regions 111.

It should be understood that the orthographic projection of the refraction structure 13 on the first surface 11a overlaps with the peripheral edges of the orthographic projections of the light emitting chips 12 in the chip growth regions 111 on the first surface 11a, so as to ensure that the light does not leak from corresponding gaps between the refraction structure 13 and the chip growth regions 111. In order to ensure that enough light irradiates the chip growth regions 111 to realize the lift-off of the light emitting chips 12, the orthographic projection of the refraction structure 13 on the first surface 11a overlaps with the peripheral edges of the orthographic projections of the light emitting chips 12 in the chip growth regions 111 on the first surface 11a without completely covering the chip growth regions 111.

In this embodiment, as shown in FIG. 2 and FIG. 4, the growth substrate further includes an adjustment layer 14. The orthographic projection of the adjustment layer 14 on the substrate 11 at least covers the non-growth region 112, and the adjustment layer 14 is located on the light incident side of the refraction structure 13.

As an example, the orthographic projection of the adjustment layer 14 on the substrate 11 covers the entire chip growth regions 111 and the non-growth region 112.

As an example, the adjustment layer 14 is also a transparent encapsulation layer, which is specifically formed of transparent materials such as epoxy resin, polyimide, and acryl, and is used to encapsulate the refraction structure 13 on the second surface 11b of the substrate 11.

As an example, the refraction structure 13 is formed of a transparent material such as SiNx.

In this embodiment, the refractive index of the adjustment layer 14 is n1, the refractive index of the refraction structure 13 is n2, and n1>n2.

It should be understood that the refractive index of the refraction structure 13 formed of a transparent material such as SiNx is generally greater than 1.9, while the refractive index of air is generally about 1.0 in a standard state. At this time, if the light directly enters the refraction structure 13 through the air, the refraction angle of the refraction structure 13 cannot meet the requirement that most of the light propagates to the vicinity of the chip growth regions 111 and then irradiate positions between the light emitting chips 12 and the first surface 11a. Therefore, the adjustment layer 14 is arranged on the light incident side of the refraction structure 13, and the refraction index of the adjustment layer 14 is greater than that of the refraction structure 13, so that most of the light will propagate to the vicinity of the chip growth regions 111 and then irradiate positions between the light emitting chips 12 and the first surface 11a.

In this embodiment, as shown in FIG. 1, the vertical distance between two adjacent chip growth regions 111 is d, the maximum height of the refraction structure is h, the incident angle of the refraction structure 13 is $\alpha1$ (that is, the included angle between the incident light and the normal line A of the incident surface is $\alpha1$), the refraction angle of the refraction structure 13 is a2 (the included angle between the refracted light and the normal line A is a2), and the following relationship is satisfied: $2\cos(\alpha2-\alpha1) \times h > d$. At this time, it can be almost completely guaranteed that the light emitted by the laser isn't emitted from the region directly opposite to the non-growth region 112 after passing through the refraction structure 13, but is emitted to the positions between the first surface 11a and the light emitting chips 12. Therefore, it is guaranteed that the light emitted from the laser hardly irradiates the driving backplane, and this part of the light can be used to perform the lift-off on the light emitting chips 12 to increase the utilization rate of the light.

In some embodiments, the refraction structure 13 has a bottom structural surface 132 and two side structural surfaces 131. The bottom structural surface 132 is parallel to or attached to the substrate 11. The bottom structural surface 132 has a first boundary and a second boundary that are opposite to each other. Boundaries, away from the bottom structural surface 132, of the two side structural surfaces 131 are connected to each other. A boundary, close to the bottom structural surface 132, of one of the side structural surfaces 131 is connected to the first boundary. A boundary, close to the bottom structural surface 132, of the other side structural surface 131 is connected to the second boundary. Included angles between the two side structural surfaces 131 and the bottom structural surface 132 are acute angles.

As an example, the two side structural surfaces 131 are light incident surfaces of the refraction structure 13.

As an example, the refraction structure 13 includes a triangular prism. The refraction structure 13 may be jointly formed by a plurality of triangular prisms. The bottom structural surface 132 and the two side structural surfaces 131 are three side surfaces of the triangular prism. The triangular prism further includes two bottom surfaces 133, both of which are perpendicular to the substrate 11. The two bottom surfaces 133 of the triangular prism are in the shape of an isosceles triangle.

As an example, the two bottom surfaces 133 of each triangular prism are in the shape of an isosceles triangle, and the bottom structural surface 132 of each triangular prism is connected to the substrate 11. The triangular prisms are closely arranged without gaps. In addition, it ensures that each light incident surface of the refraction structure 13 is inclined relative to the second surface 11b.

It should be understood that the refraction structure 13 is integrally formed.

As an example, the two bottom surfaces 133 of the triangular prism for forming the refraction structure 13 are both in the shape of an isosceles right triangle. Of course, in other embodiments, the two bottom surfaces 133 of the triangular prism for forming the refraction structure 13 may further be in the shape of other common isosceles triangles.

It should be understood that the two bottom surfaces 133 of the triangular prism for forming the refraction structure 13 are parallel to each other, while the normal lines of the bottom structural surface 132 and the two side structural surfaces 131 are on the same plane.

In addition, as shown in FIG. 1, the two bottom surfaces 133 of the triangular prism for forming the refraction structure 13 are both in the shape of an isosceles triangle, which can ensure that the distances between the highest vertex 13a of the refraction structure 13 (the vertex 13a of the triangular prism having the largest distance from the second surface 11b) and two adjacent light emitting chips 12 are d1, and d1=½d, that is, after the bottom structural surface 132 of the triangular prism for forming the refraction structure 13 is connected to the second surface 11b, the remaining two side structural surfaces 131 are arranged symmetrically. Therefore, when the light emitted by the laser irradiates directly above the light incident side of the refraction structure 13, the total amount of light received by the two side structural surfaces 131 of the refraction structure 13 of the triangular prism is almost uniform. In addition, the directions of the light passing through the two side structural surfaces 131 are opposite, so that the light correspondingly emitted to the middle region of the non-growth region 112 may propagate toward the chip growth regions 111 on both sides of the non-growth region 112, so as to prevent the light from interfering with each other after passing through the two side structural surfaces 131. At the same time, the laser energy received by the light emitting chips 12 in two adjacent chip growth regions 111 is almost the same, which facilitates the control of the laser energy.

In other embodiments, the refraction structure 13 may also be one of other structures capable of refracting light, such as cones, pyramids, quadrangular prisms, and pentagonal prisms.

In this embodiment, as shown in FIG. 1 to FIG. 3 and FIG. 6, the refraction structure 13 is jointly formed by a plurality of triangular prisms.

In this embodiment, the growth substrate further includes a light shielding layer 15, and the junction of the two side structural surfaces 131 is shielded by the light shielding layer 15. The junction of the two side structural surfaces 131 includes a position at which the vertex 13a of the refraction structure 13 is located.

As an example, the light shielding layer 15 is disposed on the adjustment layer 14, and is also located on the light incident side of the adjustment layer 14. Of course, in other embodiments, the light shielding layer 15 may be directly disposed on the refraction structure 13, and is located on the light incident side of the refraction structure 13, so as to meet the requirement that the light incident side at the vertex 13a of the refraction structure 13 is provided with the light shielding layer 15.

It should be understood that in order to avoid that the light cannot be refracted at the vertex 13a of the triangular prism for forming the refraction structure 13, a corresponding position may be coated with a strip of the black light shielding layer 15 to directly prevent the light from entering the triangular prism from the vertex of the triangular prism for forming the refraction structure 13. The vertex 13a of the triangular prism here should be the highest apex 13a of the triangular prism relative to the second surface 11b.

In other embodiments, the edges for connecting the highest vertices 13a of the triangular prisms may further be covered with a strip of the black light shielding layer 15 to prevent the light from entering the triangular prisms from the edges and directly passing through the substrate 11.

In this embodiment, the orthographic projection of the adjustment layer 14 on the substrate 11 further covers the chip growth regions 111; and the surface, away from the refraction structure 13, of the adjustment layer 14 is a plane parallel to the substrate 11.

It should be understood that the surface, away from the refraction structure 13, of the adjustment layer 14 is a horizontal plane. However, the laser light is vertically incident almost from a position directly above the adjustment layer 14. Therefore, when the light passes through the adjustment layer 14, the angle does not change or the change may be ignored.

In this embodiment, the refractive index of the substrate 11 is n3, the refractive index of the refraction structure 13 is n2, and n3<n2.

It should be understood that the refractive index n3 of the sapphire substrate 11 is generally 1.8. In order to ensure that when the light enters the sapphire substrate from the refraction structure 13, the refracted light is not emitted from the range of the LED chip after passing through the sapphire substrate, the following relationship needs to be satisfied: n2>n3.

In this embodiment, the light emitting chip 12 includes a P-type semiconductor layer or an N-type semiconductor layer in contact with the first surface 11a. Either the P-type semiconductor layer or the N-type semiconductor layer is formed of GaN (gallium nitride). Therefore, when the light emitted by the laser irradiates the GaN layer of the light emitting chip 12 from one side of the second surface 11b toward the first surface 11a, the light emitting chip 12 is separated from the first surface 11a, so that the lift-off of the light emitting chip 12 and substrate 11 is realized.

In this embodiment, the light emitting chip 12 is a micron light emitting diode chip (Micro LED chip). Each light emitting chip 12 includes an undoped semiconductor layer (U-GaN), and an N-type semiconductor layer, a multi-quantum well layer and a P-type semiconductor layer that are sequentially stacked on the undoped semiconductor layer.

It should be understood that the N-type semiconductor layer is an impurity semiconductor layer with a concentration of free electrons being much higher than that of holes, while the P-type semiconductor layer, also called a hole-type semiconductor layer, is a semiconductor layer in which positively charged holes are mainly conductive. The N-type semiconductor layer is, for example, formed of N-type doped gallium nitride (N-GaN). The P-type semiconductor layer is, for example, formed of P-type doped gallium nitride (P-GaN).

Embodiment 2

Figure 7:
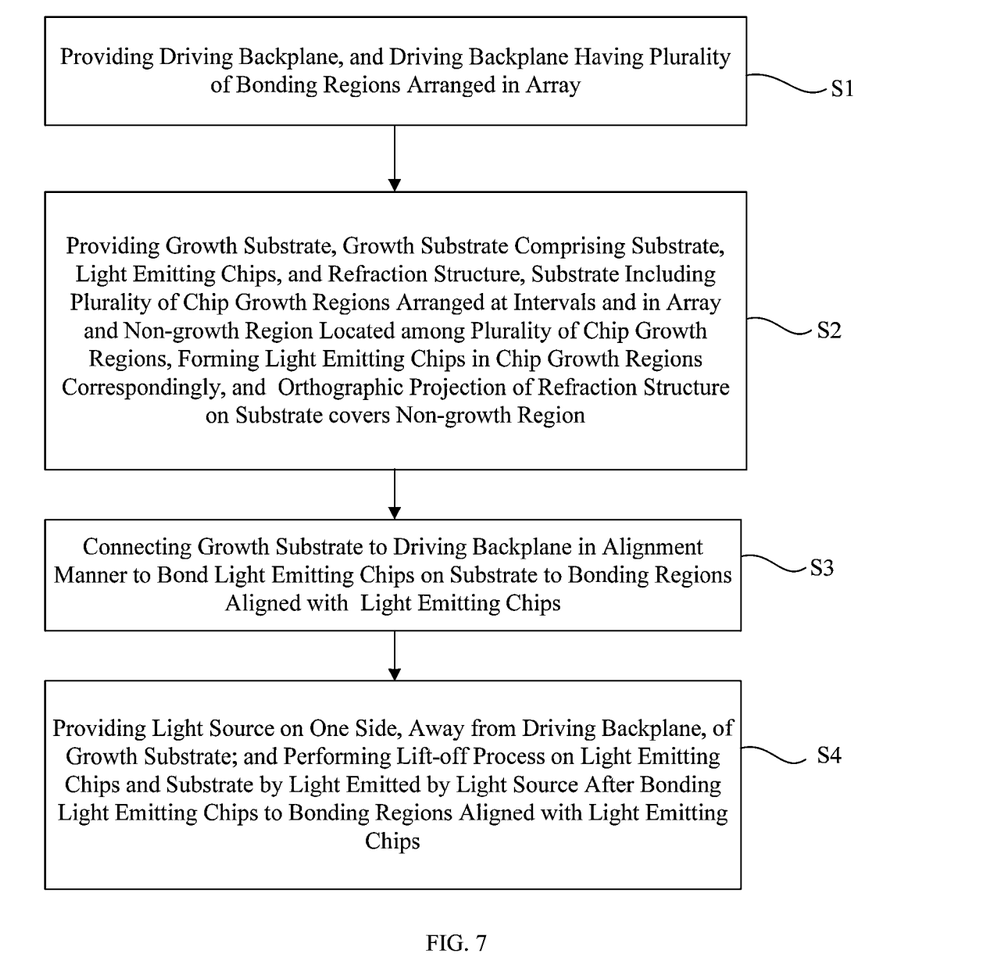
FIG. 7 is a block diagram showing a manufacturing flow of steps S1-S4 of a display panel according to Embodiment 2 of the present disclosure.
Figure 9:
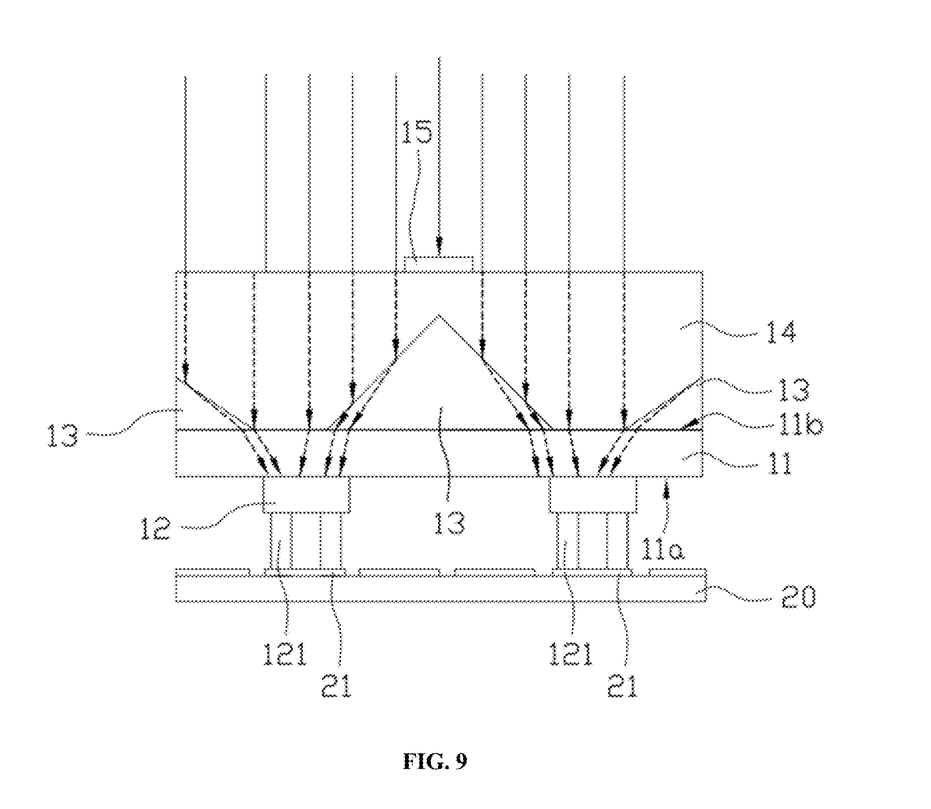
FIG. 9 shows a schematic diagram of light paths when a growth substrate is transferred to a driving backplane according to Embodiment 2 of the present disclosure.

As shown in FIG. 7 and FIG. 9, the second aspect of the present disclosure discloses a manufacturing method of a display panel. According to the manufacturing method, the growth substrate in Embodiment 1 is used to transfer a light emitting chip 12 to a driving backplane 20 of the display panel.

In this embodiment, a manufacturing method of a display panel includes:

S1: providing a driving backplane 20, where the driving backplane 20 has a plurality of bonding regions 21 arranged in an array.

S2: providing a growth substrate.

In this embodiment, the growth substrate includes a substrate 11, light emitting chips 12, and a refraction structure 13. The substrate 11 includes a plurality of chip growth regions 111 arranged at intervals and in an array and a non-growth region 112 located among the plurality of chip growth regions 111. The light emitting chips 12 are correspondingly formed in the chip growth regions 111. The orthographic projection of the refraction structure 13 on the substrate 11 covers the non-growth region 112.

Figure 8:
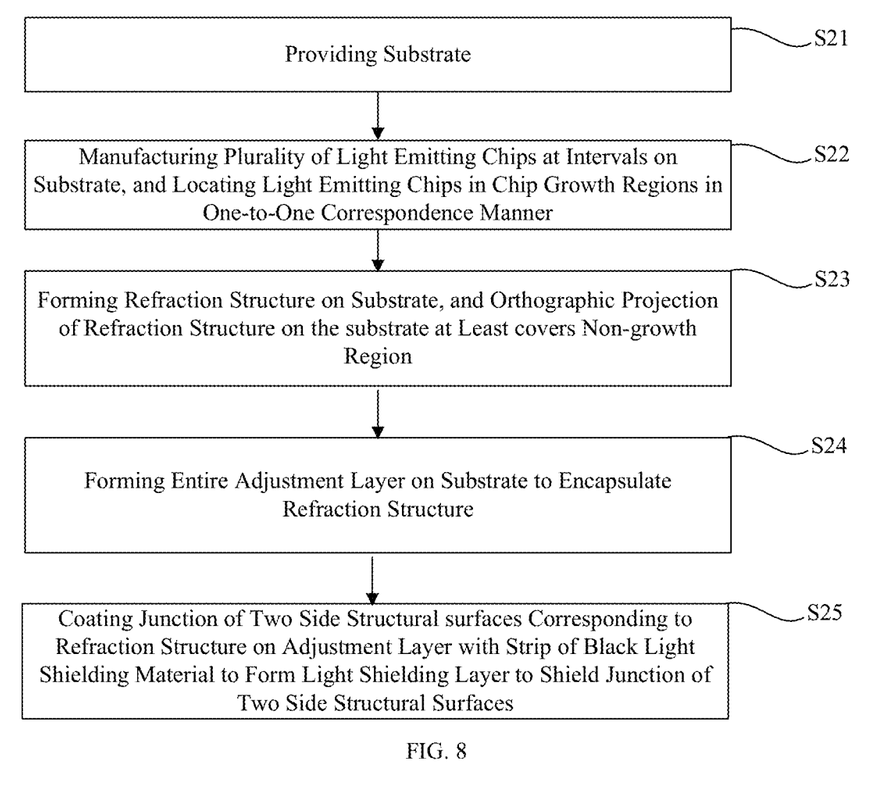
FIG. 8 is a block diagram showing a manufacturing flow of steps S21-S25 of a display panel according to Embodiment 2 of the present disclosure.

As shown in FIG. 8, the providing a growth substrate includes:

S21: providing a substrate 11, where the substrate 11 is made of a sapphire material, the refractive index of the substrate is n3, and n3 is generally 1.8.

It should be understood that the substrate 11 includes a plurality of chip growth regions 111 arranged at intervals and in an array and a non-growth region 112 located among the plurality of chip growth regions 111.

S22: manufacturing a plurality of light emitting chips 12 arranged at intervals on the first surface 11a of the substrate 11, where all the light emitting chips 12 are located in the chip growth regions 111 in a one-to-one correspondence manner. The sizes of the chip growth regions 111 are set according to the sizes of the light emitting chips 12, so as to ensure that the chip growth regions 111 are completely covered with the light emitting chips 12.

As an example, the light emitting chip 12 is a micron light emitting diode chip (Micro LED chip). Each light emitting chip 12 includes an undoped semiconductor layer (U-GaN), and an N-type semiconductor layer, a multi-quantum well layer and a P-type semiconductor layer that are sequentially stacked on the undoped semiconductor layer.

It should be understood that the P-type semiconductor layer or the N-type semiconductor layer of the light emitting chip 12 is in contact with the first surface 11a. The N-type semiconductor layer is, for example, formed of N-type doped gallium nitride (N-GaN). The P-type semiconductor layer is, for example, formed of P-type doped gallium nitride (P-GaN).

As an example, the light emitting chip 12 further includes an electrode part 121 which is disposed on one side, away from the first surface 11a, of the light emitting chip 12, and is used to be bonded to the driving backplane 20 of the display panel.

In this embodiment, the light emitting chip 12 is, for example, one of Micro LED chips having a light emitting color of red, green or blue.

S23: forming a refraction structure 13 on the second surface 11b of the substrate 11, where the orthographic projection of the refraction structure 13 on the substrate 11 at least covers the non-growth region 112.

As an example, the refraction structure 13 is formed of a transparent material such as SiNx.

As an example, the refraction structure 13 has a bottom structural surface 132 and two side structural surfaces 131. The bottom structural surface 132 is parallel to or attached to the substrate. The bottom structural surface 132 has a first boundary and a second boundary that are opposite to each other. Boundaries, away from the bottom structural surface 132, of the two side structural surfaces 131 are connected to each other so as to form one edge of the triangular prism. A boundary, close to the bottom structural surface 132, of one of the side structural surfaces 131 is connected to the first boundary. A boundary, close to the bottom structural surface 132, of the other side structural surface 131 is connected to the second boundary. Included angles between the two side structural surfaces 131 and the bottom structural surface 132 are acute angles.

As an example, the refraction structure 13 is a triangular prism. The bottom structural surface 132 and the two side structural surfaces 131 are three side surfaces of the triangular prism. The two bottom surfaces 133 of the triangular prism are perpendicular to the substrate 11. The two bottom surfaces 133 of the triangular prism are in the shape of an isosceles triangle.

As an example, the two bottom surfaces 133 of each triangular prism are in the shape of an isosceles triangle. The bottom structural surface 132 of each triangular prism is connected to the substrate 11. The triangular prisms are closely arranged without gaps. In addition, it ensures that each light incident surface of the refraction structure 13 is inclined relative to the second surface 11b.

It should be understood that the refraction structure 13 is integrally formed.

As an example, the two bottom surfaces 133 of the triangular prism for forming the refraction structure 13 are both in the shape of an isosceles right triangle. Of course, in other embodiments, the two bottom surfaces 133 of the triangular prism for forming the refraction structure 13 may further be in the shape of other common isosceles triangles.

It should be understood that the two bottom surfaces 133 of the triangular prism for forming the refraction structure 13 are parallel to each other, while the normal lines of the bottom structural surface 132 and the two side structural surfaces 131 are on the same plane.

In addition, the two bottom surfaces 133 of the triangular prism for forming the refraction structure 13 are both in the shape of an isosceles triangle. The highest vertex 13a (the vertex 13a of the triangular prism having the largest distance from the second surface 11b) of the triangular prism is in the middle of every two LEDs, which can ensure that the distances between the highest vertex 13a of the triangular prism for forming the refraction structure 13 and two adjacent light emitting chips 12 are d1, and d1=½d.

S24: forming an entire adjustment layer 14 on the second surface 11b of the substrate 11 to encapsulate the refraction structure 13.

As an example, the adjustment layer 14 covers the entire second surface 11b.

As an example, the adjustment layer 14 is formed of transparent materials such as epoxy resin, polyimide, and acryl.

It should be understood that the refractive index of the adjustment layer 14 is n1, the refractive index of the refraction structure 13 is n2, and n1>n2.

S25: coating the junction of the two side structural surfaces 131 corresponding to the triangular prisms on the adjustment layer 14 with a strip of black light shielding material to form a light shielding layer 15 to shield the junction of the two side structural surfaces 131. The junction of the two side structural surfaces 131 includes a position at which the vertex 13a of the refraction structure 13 is located, thereby avoiding that the light cannot be refracted at the vertex 13a of the triangular prism, and finally preparing the growth substrate.

S3: connecting the growth substrate to the driving backplane 20 in an alignment manner to bond the light emitting chip 12 on the substrate 11 to a bonding region 21 therewith.

As an example, an electrode part 121 of the light emitting chip 12 is fixed to the bonding region 21 of the driving backplane 20 by melting and then cooling an indium or stannum (In/Sn) spot on the driving backplane 20 to finally complete the bonding of the light emitting chip 12 to the driving backplane 20.

In this embodiment, a plurality of bonding regions 21 are arranged at intervals. One light emitting chip 12 is correspondingly arranged in one bonding region 21. The number of the light emitting chips 12 on a single growth substrate is smaller than that of the bonding regions 21 on a single driving backplane 20.

As an example, when a display panel product with three colors of R (red), G (green) and B (blue) is manufactured, the number of the bonding regions 21 on a single driving backplane 20 is three times that of the light emitting chips 12 on a single growth substrate. If so, when a display panel with four colors of R (red), G (green), B (blue) and W (white), the number of the bonding regions 21 on a single driving backplane 20 is four times that of the light emitting chips 12 on a single growth substrate. The relationship between the number of the bonding regions 21 on a single driving backplane 20 and the number of light emitting chips 12 on a single growth substrate can be deduced by analogy.

It should be understood that when a display panel product with three colors is manufactured, it needs to transfer the light emitting chips 12 for three times. After the first transfer of the light emitting chips 12 (such as the transfer of R LEDs), two bonding regions 21 to which the light emitting chips 12 are not bonded should remain between the two light emitting chips 12, so as to facilitate the transfer of the light emitting chips 12 (such as the transfer of G LEDs and B LEDs) for two subsequent times. After the second transfer of the light emitting chips 12 (such as the transfer of G LEDs), a bonding region 21 to which the light emitting chips 12 are not bonded should remain between the two light emitting chips 12, so as to facilitate the last transfer of the light emitting chips 12 (such as the transfer of B LEDs). When the light emitting chips 12 are transferred for the last time, the light emitting chips (such as the transfer B LEDs) are directly transferred to the remaining bonding regions 21.

S4: providing a light source on one side, away from the driving backplane 20, of the growth substrate; and performing a lift-off process on the light emitting chips 12 and the substrate 11 by virtue of light emitted by the light source after the light emitting chips 12 are bonded to the bonding regions 21 aligned with the light emitting chips 12.

As an example, by means of LLO (laser lift off), the laser light irradiates directly above the substrate 11 from one side of the second surface 11b toward the first surface 11a.

It should be understood that when the light emitted by the laser irradiates the GaN of the light emitting chips 12 from one side of the second surface 11b toward the first surface 11a, the light emitting chips 12 is separated from the first surface 11a, thereby realizing the lift-off of the light emitting chips 12 and the substrate 11.

In this embodiment, LLO (laser lift-off) is performed after the light emitting chips 12 are bonded to the driving backplane 20. Therefore, if a display panel of an RGB three-color product is to be prepared, it needs to first perform the transfer of light emitting chips of one color (such as, the light emitting chips 12 of R color) according to the steps S1-S4, and then repeat the steps S1-S4 for two times to perform the transfer of the light emitting chips 12 of G/B color, so as to prepare the display panel of the RGB three-color product.

As an example, when the light emitting chips 12 of R color are transferred, the position of the bonding region 21 for bonding the light emitting chips 12 of G/B color on the driving backplane 20 needs to be vacant. At this time, the orthographic projection of the refraction structure 13 of the growth substrate on the driving backplane 20 at least covers the positions of the bonding regions 21 corresponding to the light emitting chips 12 of G\B color. When the light emitting chips 12 of G color are transferred, the positions of the bonding regions 21 for bonding the light emitting chips 12 of color B on the driving backplane 20 need to be vacant. At this time, the orthographic projection of the refraction structure 13 of the growth substrate on the driving backplane 20 at least covers the positions of the bonding regions 21 corresponding to the light emitting chips 12 of R/B color. By analogy, when the light emitting chips 12 of B color are transferred, the positions of the bonding regions 21 for bonding the light emitting chips 12 of R/G color on the driving backplane 20 need to be vacant. At this time, the orthographic projection of the refraction structure 13 of the growth substrate on the driving backplane 20 at least covers the positions of the bonding regions 21 corresponding to the light emitting chips 12 of R\G color.

It should be understood that the light emitting chips 12 of N colors may be transferred by repeating steps S1-S4 for N times in sequence.

To sum up, after the light emitting chips 12 are manufactured in the display panel in this embodiment, the refraction structure 13 having a triangular prism with a cross section being in the shape of an isosceles triangle is formed in the non-growth region 112 (that is, the gap region between the light emitting chips 12) on the second surface 11b of the substrate 11, and the refractive index of the refraction structure 13 is n2. Then, an adjustment layer 14 with a horizontal surface is formed of a transparent material such as epoxy resin, polyimide, or acryl, so as to encapsulate the refraction structure 13. The refractive index of the adjustment layer 14 is n1, and n1>n2. When entering from one side of the second surface 11b, the laser light first enters the adjustment layer 14. After the light passes through the adjustment layer 14, the angle hardly changes; and then the light is emitted from the adjustment layer 14 toward the side structural surfaces 131 of the refraction structure 13 to be refracted. The incident angle is $\alpha 1$ (equal to the included angle between the side structural surfaces 131 of the triangular prism and the second surface 11b of the substrate 11, that is, the included angle between the incident light and the normal line A of the incident surface is $\alpha 1$), and the refraction angle is $\alpha 2$ (the included angle between the refracted light and the normal line A is α2), and Sin α1/Sin α2=n2/n1. Then, the light between adjacent light emitting chips 12 is gathered toward the light emitting chips 12 to irradiated the GaN of the light emitting chips 12, instead of being emitted from the non-growth region 112, so as to prevent the laser light from irradiating the driving backplane 20, and moreover, the utilization rate of the laser light is increased.

If the distance between two light emitting chips 12 is d, and the distance between the highest vertex 13a of the triangular prism for forming the refraction structure 13 and the substrate 11 is h, the shape and material refractive index of the refraction structure 13 need to satisfy the following relationship: $2 \cos(α2-α1) \times h > d$.

In addition, since light cannot be refracted at the vertex 13a of the triangular prism for forming the refraction structure 13, a corresponding position may be coated with a strip of black light shielding material.

Accordingly, the refractive index n3 of the substrate 11 made of a sapphire material is generally 1.8. In order to ensure that the light enters the substrate 11 made of a sapphire material from the refraction structure 13, and to avoid that the refracted light is not emitted to the light emitting chip 12 after passing through the substrate 11 made of a sapphire material, the following relationship needs to be satisfied: n2>n3. Meanwhile, the orthographic projection of the triangular prism for forming the refraction structure 13 on the substrate 11 cannot completely cover that of the light emitting chip 12 on the substrate 11, so as not to affect the lift-off of the light emitting chip 12.

For other structures of the growth substrate, please refer to Embodiment 1, which will not be repeated here.

Embodiment 3

A third aspect of the present disclosure discloses a display panel, which is manufactured according to the manufacturing method in the Embodiment 2.

The display panel can be used in mobile phones, computers, vehicle displays, electronic billboards, etc.

In addition, the terms "first" and "second" are used for descriptive purposes only, and are not to be construed as indicating or implying relative importance or implicitly specifying the quantity of indicated technical features. Thus, a feature defined as "first" and "second" may explicitly or implicitly include one or more of these features. In the description of the present disclosure, "plurality" means two or more, unless otherwise specifically defined.

In the present disclosure, unless otherwise clearly stipulated and limited, terms such as "assembly" and "connection" should be understood in a broad sense, for example, it can be a fixed connection, a detachable connection, or an integral body; it can be a mechanical connection, or an electrical connection; it can be a direct connection, or an indirect connection through an intermediary; and it can be an internal communication between two elements or an interaction relationship between two elements. Those of ordinary skill in the art can understand the specific meanings of the above terms in the present disclosure according to specific situations.

In the description of the specification, descriptions with reference to the terms "some embodiments", "exemplarily" and the like mean that specific features, structures, materials or characteristics described in conjunction with the embodiments or examples are included in at least one embodiment or example of the present disclosure. In the specification, the schematic representations of the above terms are not necessarily directed to the same embodiment or example. Furthermore, the described specific features, structures, materials or characteristics may be combined in any suitable manner in any one or more embodiments or examples. In addition, different embodiments or examples and features of different embodiments or examples described in the specification may be combined and incorporated by those skilled in the art without conflicting with each other.

Although the embodiments of the present disclosure have been shown and described above, it can be understood that the above embodiments are exemplary and should not be construed as limitations on the present disclosure. Those of ordinary skill in the art can make changes, modifications, substitutions and alterations to the above embodiments with the scope of the present disclosure, so that changes or modifications made in accordance with the claims and the specification of the present disclosure shall fall within the scope of the present patent disclosure.

What is claimed is:

1. A growth substrate, comprising:
   a substrate comprising a plurality of chip growth regions arranged at intervals and in an array, and a non-growth region located among the plurality of chip growth regions;
   a refraction structure disposed on the substrate, an orthographic projection of the refraction structure on the substrate covering the non-growth region without overlapping with at least parts of the chip growth regions, wherein the refraction structure is configured to refract light corresponding to the non-growth region to positions corresponding to the chip growth regions;
   wherein the substrate has a first surface and a second surface that are opposite to each other in a thickness direction of the substrate, and light emitting chips are grown in the chip growth regions of the first surface, wherein the refraction structure is disposed on the second surface, the orthographic projection on the substrate covers the non-growth region; and one side, away from the substrate, of the refraction structure is a light incident side.

2. The growth substrate according to claim 1, wherein the orthographic projection of the refraction structure on the substrate further covers edges of the chip growth regions.

3. The growth substrate according to claim 1, wherein a vertical distance between two adjacent chip growth regions is d, a maximum height of the refraction structure is h, an incident angle of the refraction structure is α1, a refraction angle of the refraction structure is α2, and the following relationship is satisfied:

$$2 \cos(α2-α1) \times h > d.$$

4. The growth substrate according to claim 1, wherein the growth substrate further comprises an adjustment layer, wherein an orthographic projection of the adjustment layer on the substrate at least covers the non-growth region, and the adjustment layer is located on the light incident side of the refraction structure, wherein a refractive index of the adjustment layer is n1, a refractive index of the refraction structure is n2, and n1>n2.

5. The growth substrate according to claim 4, wherein the refraction structure has a bottom structural surface and two side structural surfaces, wherein the bottom structural surface is parallel to or attached to the substrate, and has a first boundary and a second boundary that are opposite to each other, wherein boundaries, away from the bottom structural surface, of the two side structural surfaces are connected to each other, wherein a boundary, close to the bottom structural surface, of one of the side structural surfaces is connected to the first boundary, a boundary, close to the bottom structural surface, of the other side structural surface is connected to the second boundary, and included angles between the two side structural surfaces and the bottom structural surface are acute angles.

6. The growth substrate according to claim 5, wherein the refraction structure comprises a triangular prism, and the bottom structural surface and the two side structural surfaces are three side surfaces of the triangular prism, wherein two bottom surfaces of the triangular prism are perpendicular to the substrate, the two bottom surfaces of the triangular prism are in a shape of an isosceles triangle;
   wherein the growth substrate further comprises a light shielding layer, a junction of the two side structural surfaces is shielded by the light shielding layer;
   wherein an orthographic projection of the adjustment layer on the substrate further covers the chip growth regions; and
   wherein the surface, away from the refraction structure, of the adjustment layer is a plane parallel to the substrate.

7. The growth substrate according to claim 6, wherein the two bottom surfaces of the triangular prism for forming the refraction structure are parallel to each other, and normal lines of the bottom structural surface and the two side structural surfaces are on a same plane.

8. The growth substrate according to claim 6, wherein the two bottom surfaces of the triangular prism for forming the refraction structure are both in a shape of an isosceles right triangle.

9. The growth substrate according to claim 5, wherein the growth substrate further comprises a light shielding layer, a junction of the two side structural surfaces is shielded by the light shielding layer.

10. The growth substrate according to claim 5, wherein an orthographic projection of the adjustment layer on the substrate further covers the chip growth regions; and
    wherein the surface, away from the refraction structure, of the adjustment layer is a plane parallel to the substrate.

11. The growth substrate according to claim 4, wherein the orthographic projection of the adjustment layer on the substrate covers an entirety of the chip growth regions and the non-growth region.

12. The growth substrate according to claim 4, wherein the adjustment layer is a transparent encapsulation layer.

13. The growth substrate according to claim 1, wherein a refractive index of the substrate is n3, a refractive index of the refraction structure is n2, and n3<n2.

14. The growth substrate according to claim 1, wherein the light emitting chips are Mini LEDs or Micro LEDs.

* * * * *